United States Patent [19]

Wang et al.

[11] Patent Number: 4,559,459
[45] Date of Patent: Dec. 17, 1985

[54] HIGH GAIN NON-LINEAR THRESHOLD INPUT JOSEPHSON JUNCTION LOGIC CIRCUIT

[75] Inventors: Tsing-Chow Wang, Norristown; Richard M. Josephs, Willow Grove, both of Pa.

[73] Assignee: Sperry Corporation, New York, N.Y.

[21] Appl. No.: 480,524

[22] Filed: Mar. 30, 1983

[51] Int. Cl.$^4$ ............................................. H03K 19/195
[52] U.S. Cl. ................................... 307/462; 307/306; 307/476
[58] Field of Search ............... 307/245, 277, 306, 462, 307/476; 365/162

[56] References Cited

U.S. PATENT DOCUMENTS 4,117,354 9/1978 Gheewala ............................ 307/306

Primary Examiner—John Zazworsky
Attorney, Agent, or Firm—John B. Sowell; Thomas J. Scott; Marshall M. Truex

[57] ABSTRACT

A high gain Josephson junction logic circuit is provided. The novel circuit comprises a high gain non-linear threshold input Josephson junction logic circuit which is coupled to a high gain Josephson junction amplifier. The high gain input circuit provides the capability of driving a larger number of output circuits or employing a larger number of input signals.

9 Claims, 6 Drawing Figures

HIGH GAIN NON-LINEAR THRESHOLD INPUT JOSEPHSON JUNCTION LOGIC CIRCUIT

BACKGROUND OF THE INVENTION

1. Field of the Invention

This invention relates to an improved superconductive Josephson junction logic circuit and more particularly, to a novel Josephson junction logic circuit having a high gain input.

2. Related Applications

This invention is an improvement of our co-pending applications entitled "Three Josephson Junction Direct-Coupled Isolation Circuit", U.S. Ser. No. 298,148, filed Aug. 31, 1981 and now U.S. Pat. No. 4,413,196 and "A Four Josephson Junction Direct-Coupled And Gate Circuit", U.S. Ser. No. 298,149, filed Aug. 31, 1981 and now U.S. Pat. No. 4,413,197. These applications show and describe high gain output circuits in which the output branch of the Josephson junction amplifier displays a non-linear threshold characteristic.

3. Description of the Prior Art

The prior art logic circuits employing Josephson junction devices are generally classified in U.S. Class USC 307, sub class 306 with superconductive devices. The prior art includes Josephson junction logic circuits disclosed in IEEE, International Electron Devices Meeting at Washington, D.C., Dec. 3–5, 1979 at pages 482–484. The Josephson junction logic circuits described in this article are based on direct coupled logic (DCL). The logic circuits described in this article display linear threshold characteristics.

The prior art also includes IEEE, Transaction on Magnetics Vol. 15, No. 6, Nov., 1979 at pages 1876–1879. This prior art circuit has been referred to as the Josephson Atto-Weber switch (JAWS). This logic circuit employs a two input logic driver with an extra d.c. input bias. The logic circuit shown and described in this article in FIG. 1 also displays a linear threshold characteristic at the input and the output.

Both of the above-mentioned Josephson junction logic circuits are complex and display linear threshold characteristics which limit the gain and the operating region of the devices in the output stage.

It would be desirable to further improve the gain characteristics of the aforementioned related application circuits so that they may be employed as logic module building blocks for high performance data processing applications.

SUMMARY OF THE INVENTION

It is a principal object of the present invention to provide novel Josephson junction logic circuits for use as building blocks in data processing systems.

It is another principal object of the present invention to provide novel Josephson junction logic circuits which have multiple inputs and provide faster switching of the input logic circuit to provide greater sensitivity and higher gain to the output stage.

It is another principal object of the present invention to provide novel Josephson junction logic circuits which have non-linear threshold input characteristics and provide more gain from the input to the output than prior art logic circuits.

It is another object of the present invention to provide novel Josephson junction logic circuits which have sensitive input stage logic so that a greater number of the input stage logic circuits may be driven as fan-in circuits.

It is yet another object of the present invention to provide novel Josephson junction logic circuits which have controlled and adjustable input bias for adjusting the sensitivity of the input signals.

It is a general object of the present invention to provide high gain non-linear threshold Josephson junction logic circuits which may be employed as AND gates or OR gates.

According to these and other objects of the present invention, there is provided a Josephson junction circuit having an input branch and an output branch wherein the input node in the input branch is driven by non-linear threshold input logic circuits which comprise a plurality of input lines and a biasing current for providing a non-linear threshold characteristic at the input node which results in an enhanced gain.

DESCRIPTION OF THE PREFERRED EMBODIMENT

The term "Josephson junction" as used in this application shall mean any two superconducting electrodes separated by a very thin oxide barrier and operated near 4° Kelvin temperature. The Josephson junction is capable of conducting a critical amount of current ($I_0$) before developing a voltage across the electrodes.

The term "critical current" ($I_0$) as used in this application shall mean the maximum amount of current which flows in the Josephson junction before it develops a voltage across the electrodes.

The term "threshold" as used in this application shall mean the point or series of points which define the boundary between the superconducting state and the high voltage state on an input current versus biasing current diagram.

Figure 1:
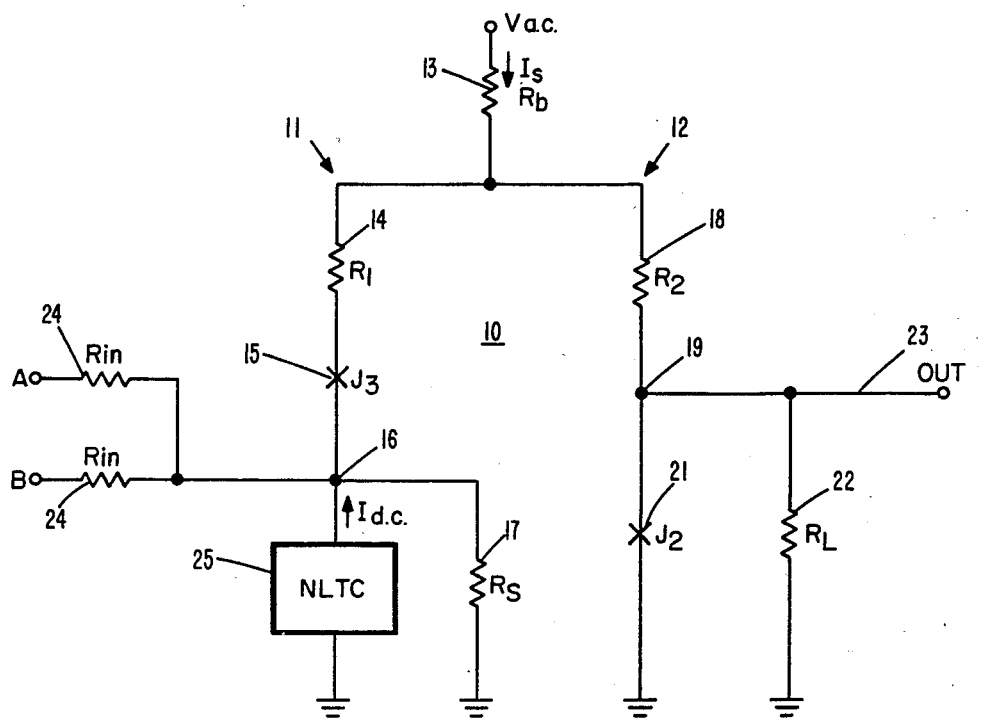
FIG. 1 is a simplified logic diagram showing a plurality of logic inputs and a non-linear threshold circuit coupled to the input node of a Josephson junction amplifying circuit.

Refer now to FIG. 1 showing a simplified logic diagram embodying the principal of the present invention. The Josephson junction amplifier circuit 10 is provided with an input branch 11 and an output branch 12. A conventional Josephson junction alternating current source provides source bias current $I_S$ through supply resistor 13 ($R_b$). Part of the bias current $I_S$ passes through the input branch resistor 14 ($R_1$) and Josephson junction device 15 ($J_3$). The current in the input branch 11 passes through input node 16 and the sink resistor 17 ($R_S$) and is connected to a convenient low reference voltage such as ground. Part of the current flowing through resistor 13 passes into the output branch 12 and flows through output branch resistor 18 ($R_2$), output node 19 and through Josephson junction device 21 ($J_2$) to the low reference voltage ground. The Josephson junction amplifying circuit 10 operates to switch Josephson junction device ($J_2$) prior to switching Josephson junction device ($J_3$) so as to divert the current in the input branch 11 to the output branch 12 and cause the current which flows to output node 19 to pass through the load resistor 22 ($R_L$) which generates an output signal on output line 23. It will be understood that the current being supplied through resistor 13 initially passes through the two branches 11 and 12 before being diverted to the output load resistor 22 by sequential operation of Josephson junction devices $J_2$ and $J_3$.

Non-linear threshold input logic circuit means 25 comprises input gate circuits at the A and B inputs having input resistors 24 ($R_{in}$) and the non-linear threshold logic circuit means 25. Both circuits are connected at the input node 16. The amplifying circuit 10 may be driven by a single Josephson junction device to produce a non-linear threshold output characteristic. The purpose of the present invention is to enhance the gain of the amplifying circuit 10 by also providing a non-linear threshold input logic circuit.

Figure 2:
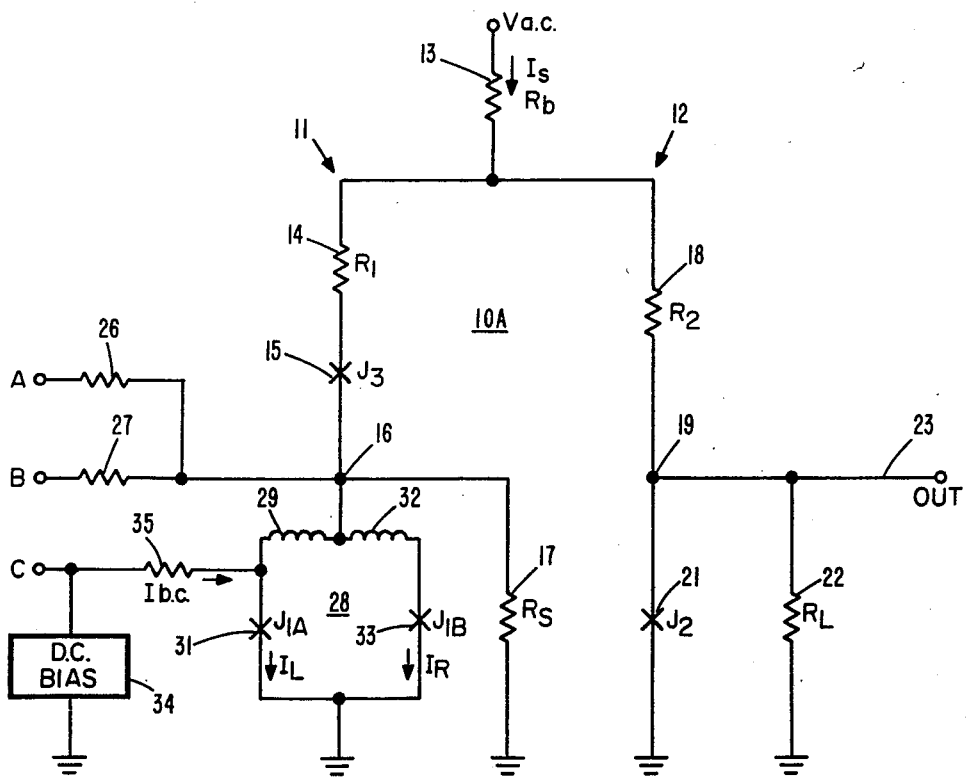
FIG. 2 is a more detailed logic OR circuit similar to FIG. 1 showing a first preferred embodiment of the non-linear threshold circuit and a D.C. bias circuit coupled to the input node of the Josephson junction amplifying circuit.

Refer now to FIG. 2 showing a more detailed logic diagram of the non-linear threshold input logic circuit means 25 connected to node 16. The input gate circuits at inputs A and B have input resistors 26 and 27 in the input lines. The Josephson junction amplifying circuit 10A is identical to the previously described amplifier circuit 10 and carries the same designations for the same elements. Interferometer 28 is also coupled to input node 16. The current $I_L$ in the left branch of interferometer 28 passes through inductance 29 and Josephson junction device 31 ($J_{1A}$). The current $I_R$ in the right branch of the interferometer 28 passes through inductance 32 and Josephson junction device 33 ($J_{1B}$). In the preferred embodiment mode of operation, the input current from the input gate circuits at the A or B input passes through node 16 and augments or adds to the source bias current $I_S$ in the input branch 11 from the current source $V_{ac}$. When the critical current $I_0$ is reached in Josephson junction device $J_{1A}$, it switches and diverts the current $I_L$ in the left branch into the right branch of the interferometer 28 and causes the Josephson junction $J_{1B}$ to switch to its voltage state. After the interferometer 28 switches, it causes the Josephson junction device $J_2$ to switch and sequentially switches the Josephson junction device $J_3$ as described hereinbefore. When a d.c. bias current source 34 supplies a bias current $I_{d.c.}$ via resistor 35 to the left branch of the interferometer 28, the bias current $I_{d.c.}$ will cause Josephson junction device $J_{1A}$ to be switched with a much smaller input signal on input lines A or B. It will be understood that either input line A or input line B is capable of supplying enough current in the presence of the d.c. bias current $I_{d.c.}$ to cause the interferometer 28 to initiate the sequential switching operation. The amount of current which eventually is supplied to the output branch 12 after Josephson junction device $J_3$ has switched is not increased. The identical signal being supplied on output line 23 is capable of driving a larger number of circuits of the type shown in FIG. 2, thus, the fan-out capability of the circuit of FIG. 2 is substantially enhanced. Not only is the gain increased but the switching time for the circuit shown in FIG. 2 is faster because the rise time of the currents on line A and B does not have to increase as much as was required for prior art type circuits.

Figure 3:
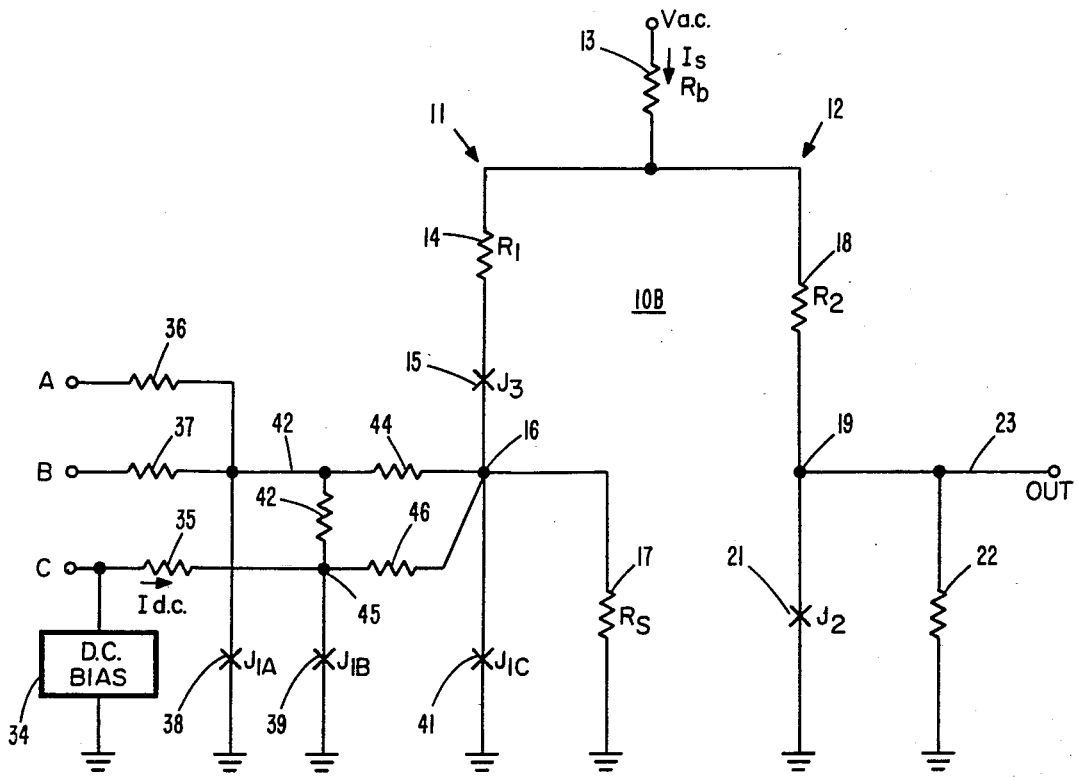
FIG. 3 is a more detailed logic OR circuit similar to FIG. 1 showing a second preferred embodiment having a non-linear threshold circuit and a d.c. biasing circuit coupled to the input node of a Josephson junction amplifying circuit.

Refer now to FIG. 3 showing another OR gate input circuit driving amplifier 10B. The non-linear threshold input logic circuit means comprises the elements shown connected to input node 16. The remaining portion of the circuit described hereinbefore is the same as has been described with reference to FIGS. 1 and 2 and the elements are numbered the same. In the embodiment of FIG. 3, inputs lines A and B are supplied with input resistors 36 and 37 respectively. In order to more clearly explain the sequence of operation of this more complex circuit, the Josephson junction devices in the non-linear threshold input logic circuit are numbered $J_{1A}$, $J_{1B}$ and $J_{1C}$ in the order of sequence of their operation. These Josephson junction devices 38, 39 and 41 are switched into their voltage state in order to switch Josephson junction device $J_2$ and then Josephson junction device $J_3$ into the voltage state. Before explaining the effect of d.c. bias 34 which is applied at input C, the sequence logic for the operation of Josephson junction devices 38, 39 and 41 will be explained first. When any of a plurality of inputs such as input A or B has sufficient current at node 42 to switch Josephson junction device 38, only Josephson junction device 38 switches. The addition of current at either input A or B to increase the current now available at node 42 is supplied through resistor 43 to Josephson junction device 39. When the critical current ($I_0$) of Josephson junction 39 $J_{1B}$ is reached, it switches into its voltage state and causes the majority of the current at node 42 to now be switched into Josephson junction device 41 ($J_{1C}$) which is in its superconducting state. In the preferred embodiment operation of Josephson junction device 41, no additional current need be supplied from an external source in order to cause the switching of Josephson junction device $J_{1C}$. After Josephson junction device $J_{1C}$ switches, it causes the Josephson junction devices $J_2$ and $J_3$ to sequentially switch as explained hereinbefore. The d.c. bias current $I_{d.c.}$ is applied via resistor 35 to the junction or node 45. Initially, this node 45 is effectively at the ground state because Josephson junction device $J_{1B}$ is in its superconducting state. Accordingly, to block the current being supplied by d.c. bias current source 34, a blocking resistor 46 is provided in the resistor network which comprises resistors 43, 44 and 46. In this embodiment, the bias current $I_{d.c.}$ only affects Josephson junction device 39 and once Josephson junction device 39 switches, the bias current $I_{d.c.}$ is available to enhance the switching time and operation of Josephson junction device 41 as explained hereinbefore. In the preferred embodiment circuit shown in FIG. 3, the resistor 43 is made twice as large as resistor 44 and resistor 44 is made twice as large as resistor 46. The input resistors 36 and 37 are both made much larger than resistor 43. The same desirable operating characteristics associated with FIG. 2 are accomplished by the OR gate logic circuit shown in FIG. 3. That is, the sensitivity of the inputs A and B and the speed of operation of the circuit 10B is an improvement over amplifying circuits of the prior art.

Figure 4:
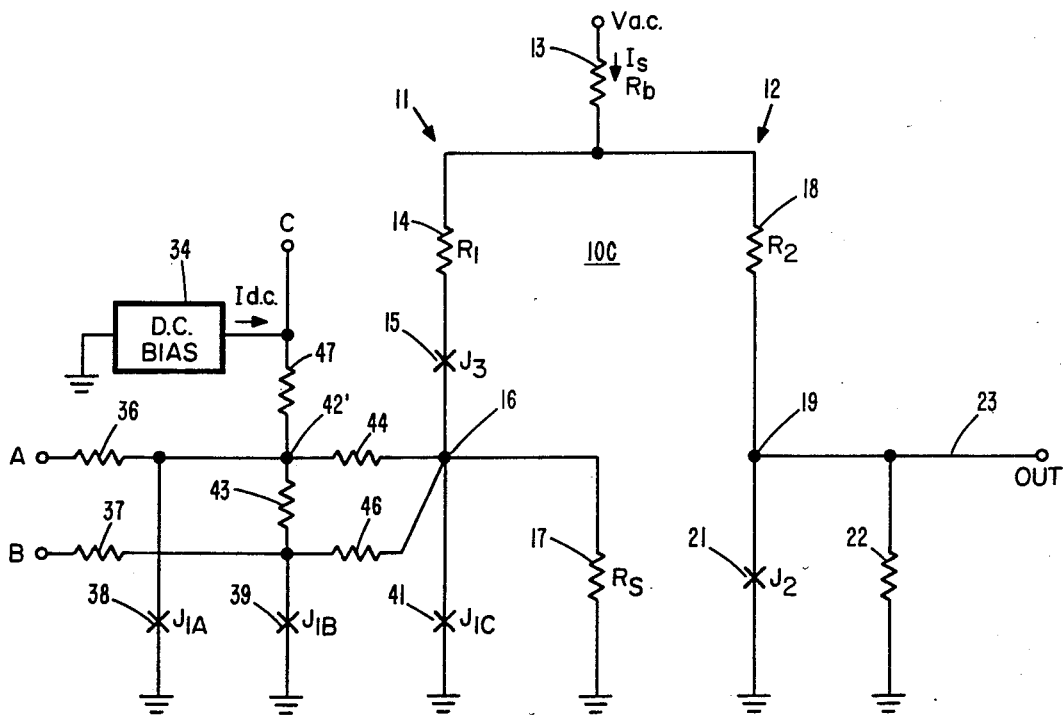
FIG. 4 is a more detailed logic circuit similar to FIG. 3 showing a modified input circuit arrangement for obtaining AND gate logic functions.

Refer now to FIG. 4 showing a modified form of the previously described FIG. 3 circuit. The amplifying circuit 10C operates in the same manner as described hereinbefore with reference to amplifying circuits 10A and 10B and the components are numbered the same. The novel non-linear threshold input logic circuit means is arranged in an AND gate configuration wherein the same Josephson junction devices $J_{1A}$, $J_{1B}$ and $J_{1C}$ are numbered 38, 39 and 41 respectively. The d.c. bias current source 34 is applied to node 42' via resistor 47 and the current at node 42' is connected directly through Josephson junction device 38 to ground. The current $I_{d.c.}$ is insufficient to switch Josephson junction device 38 into its high voltage state. When a current is applied to input A, it is added to the current being supplied to node 42' and the current is designed to be sufficient to switch Josephson junction device 38 into its high voltage state. The current now available at node 42' passes through resistors 43 and 44 according to the proportion of their magnitude. Since resistor 44 is one-half the size of resistor 43, only one third of the current at node 42' passes to Josephson junction device 39. The logic circuit is designed so that the current in Josephson junction device 39 is insufficient to switch it into its high voltage state until a current is supplied on input B. When both A and B inputs are active, Josephson junction device 39 will be switched into its voltage state and all of the currents available at the d.c. bias current source 34 and inputs A and B are now diverted into the input node 16. These currents are sufficient to switch Josephson junction device 41 which causes Josephson junction devices $J_2$ and $J_3$ to switch as described hereinbefore. It will be understood that the enhanced gain, enhanced sensitivity and speed of operation are also present in the AND gate embodiment shown in FIG. 4. The number of inputs is not limited to the two inputs shown nor was the OR gates explain in reference to FIGS. 2 and 3 which also may have a plurality of inputs larger than two. Additional AND gate inputs are preferably implemented by splitting the amount of current being supplied at input B among a plurality of inputs. It will be understood that having a plurality of current inputs for input B will place the novel circuit in the ready state when the signal at input A arrives to switch the device 41.

Figure 5:
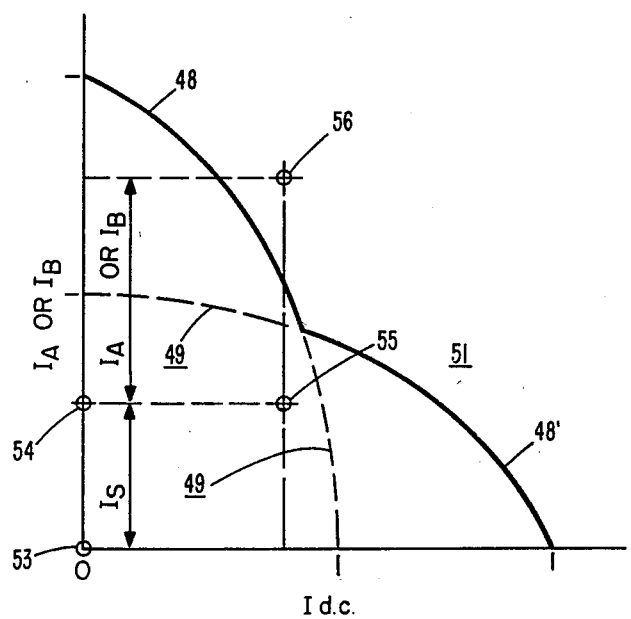
FIG. 5 is a diagram illustrating the non-linear threshold characteristics of the input logic circuit taken at the input node of the Josephson junction amplifying circuit.

Refer now to FIG. 5 showing a diagram which illustrates the non-linear threshold characteristics of the input logic circuit shown in FIG. 2. The threshold characteristic curve 48, 48' defines the zero voltage region 49 inside of the two curves 48 and 48' and defines the voltage state 51 outside of the curves 48 and 48'. Assume that the FIG. 2 circuit is inactive and no current is applied at any of the inputs which places the operation point of the input node 16 of the input circuit at the origin or zero point 53. When the biasing current $I_S$ is supplied at the source resistor 13, the operating point 53 is moved to its new operating point 54 by the magnitude of current applied $I_S$. The next current to be applied to the circuit is the d.c. bias current $I_{d.c.}$ which moves the operating point of the input circuit from point 54 to point 55. The circuit is now set so that a small amount of current $I_A$ or $I_B$ applied to either input A or B is sufficient to move the operating point 55 from the zero voltage state 49 to point 56 in the voltage state 51. Having explained a simplified operation of the circuit, it will be understood that point 55 may be reached by applying the d.c. bias current $I_{d.c.}$ before applying the source bias current $I_S$. In the preferred embodiment mode of operation of FIG. 2, the operating point 55 is always maintained inside of the zero voltage area 49 and the application of either a current at input A or B takes the operating point 55 to a point 56 which is in the voltage state 51.

Figure 6:
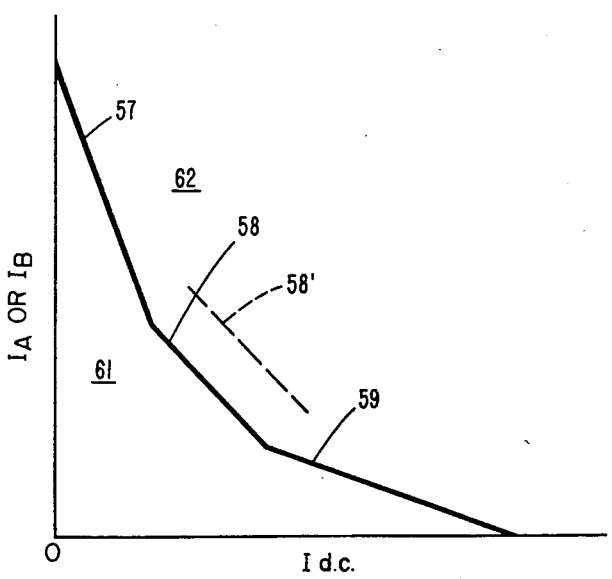
FIG. 6 is a diagram similar to FIG. 5 illustrating the non-linear threshold characteristics of the input logic circuits shown in FIGS. 3 and 4 taken at the input node of the Josephson junction amplifying circuit.

Refer now to FIG. 6 which is a diagram illustrating the non-linear threshold characteristics for the input circuits shown in FIGS. 3 and 4. The combined threshold characteristic for the input circuit shown in FIG. 6 comprises portions of the threshold curve 57, 58 and 59 representative of the individual threshold characteristics of the Josephson junction devices $J_{1A}$, $J_{1B}$ and $J_{1C}$ respectively. The zero voltage state for the combined characteristic of the input circuit is shown to the left of the threshold characteristic 57, 58 and 59 in region 61. The voltage state to the right of the threshold characteristic 57, 58 and 59 shown as the region 62. The preferred embodiment circuit shown in both FIGS. 2 and 3 applies the d.c. bias current to Josephson junction device $J_{1B}$ and any change in this biasing current tends to move the threshold characteristic 58 to the right with an decrease in biasing current as shown by the phantom line 58' (which is parallel to threshold characteristic 58). It will be understood that the d.c. biasing current may be decreased to move the threshold 58 to the right and increased to move the threshold characteristic curve 58 to the left where there is greater sensitivity.

FIGS. 5 and 6 ilustrate that the voltage state (high impedance state) of the input circuits described is reached with less input current.

Having explained preferred embodiment non-linear threshold input logic circuits which enhance the gain, sensitivity and speed of operation of the Josephson junction amplifier circuit to which it is connected, it will be understood that sufficient additional gain is provided at the input fan-in of the novel circuit that a larger number of the new novel logic circuits may be driven so as to effectively increase fan-out capability.

Having explained the preferred mode of operation and how modifications can be made to generate both multiple input OR circuits and multiple input AND circuits, other logic circuits employing novel non-linear threshold input logic can be made employing known circuit modifications at the inputs A and B etc.

We claim:

1. A high gain non-linear threshold input logic circuit, comprising:
   a supply current source,
   a low reference voltage,
   an output branch connected in series between said supply current source and said low reference voltage,
   said output branch comprising an output branch resistor in series with an output Josephson junction device,
   an input branch connected in series between said supply current source and said low reference voltage,
   said input branch comprising a branch resistor, an input Josephson junction device and a sink resistor in series,
   an input node between said input Josephson junction device and said sink resistor,
   non-linear threshold input logic circuit means coupled to said input node of said input branch,
   said non-linear threshold input logic circuit means comprising a plurality of input gate circuits coupled to said input node, biasing means for applying a biasing current to said input node, and said non-linear threshold input logic circuit means being coupled to said input node and said biasing means for providing a non-linear input threshold characteristic.

2. A high gain non-linear threshold input logic circuit as set forth in claim 1 wherein said non-linear threshold input logic circuit means comprises an interferometer coupled between said low reference voltage and said input node.

3. A high gain non-linear threshold input logic circuit as set forth in claim 2 wherein said interferometer comprises a plurality of branches and wherein said biasing means is coupled to one branch of said interferometer.

4. A high gain non-linear threshold logic input circuit as set forth in claim 3 wherein said plurality of input gate circuits comprise inputs of an OR gate logic circuit.

5. A high gain non-linear threshold input logic circuit as set forth in claim 1 wherein said non-linear threshold input logic circuit means comprises a resistor network coupled between said low reference voltage and said input node.

6. A high gain non-linear threshold input logic circuit as set forth in claim 5 wherein said resistor network further comprises source resistors in each of said plurality of input gate circuits, and a third Josephson junction device coupled between said input gate circuits and said low reference voltage.

7. A high gain non-linear threshold input logic circuit as set forth in claim 6 which further includes a bridging resistor forming a shunt across said source resistors in said plurality of input gate circuits.

8. A high gain non-linear threshold input logic circuit as set forth in claim 7 wherein said plurality of input gate circuits each comprise an input of an AND gate.

9. A high gain non-linear threshold input logic circuit as set forth in claim 5 wherein said plurality of input gate circuits are coupled to fourth and fifth Josephson junction devices which are adapted to sequentially switch a third Josephson junction device having a non-linear threshold characteristic.

* * * * *